(12) United States Patent
Park et al.

(10) Patent No.: US 11,174,401 B2
(45) Date of Patent: *Nov. 16, 2021

(54) UV-CURABLE INK COMPOSITION, METHOD FOR PRODUCING BEZEL PATTERN OF DISPLAY SUBSTRATE USING SAME, AND BEZEL PATTERN PRODUCED THEREBY

(71) Applicant: LG CHEM, LTD., Seoul (KR)

(72) Inventors: Sung-Eun Park, Daejeon (KR); Yong-Sung Goo, Daejeon (KR); Seung-A Back, Daejeon (KR); Joon-Hyung Kim, Daejeon (KR)

(73) Assignee: LG CHEM, LTD., Seoul (KR)

( * ) Notice: Subject to any disclaimer, the term of this patent is extended or adjusted under 35 U.S.C. 154(b) by 298 days.

This patent is subject to a terminal disclaimer.

(21) Appl. No.: 15/325,373

(22) PCT Filed: Sep. 30, 2015

(86) PCT No.: PCT/KR2015/010342
§ 371 (c)(1),
(2) Date: Jan. 10, 2017

(87) PCT Pub. No.: WO2016/048116
PCT Pub. Date: Mar. 31, 2016

(65) Prior Publication Data
US 2017/0198157 A1    Jul. 13, 2017

(30) Foreign Application Priority Data

Sep. 26, 2014 (KR) .................. 10-2014-0129417
Sep. 30, 2015 (KR) .................. 10-2015-0138095

(51) Int. Cl.
| | | |
|---|---|---|
| C09D 11/101 | (2014.01) | |
| B41M 7/00 | (2006.01) | |
| C09D 11/03 | (2014.01) | |
| C09D 11/102 | (2014.01) | |
| C09D 11/36 | (2014.01) | |
| C09D 11/38 | (2014.01) | |
| B41F 17/00 | (2006.01) | |
| C09D 11/037 | (2014.01) | |
| C09D 11/324 | (2014.01) | |
| G09F 9/00 | (2006.01) | |
| C08F 2/48 | (2006.01) | |
| C09D 11/00 | (2014.01) | |
| C09D 171/00 | (2006.01) | |
| B41J 11/00 | (2006.01) | |
| H05K 1/09 | (2006.01) | |
| H05K 3/12 | (2006.01) | |

(52) U.S. Cl.
CPC .......... *C09D 11/101* (2013.01); *B41F 17/006* (2013.01); *B41J 11/002* (2013.01); *B41M 7/00* (2013.01); *B41M 7/009* (2013.01); *C08F 2/48* (2013.01); *C09D 11/00* (2013.01); *C09D 11/03* (2013.01); *C09D 11/037* (2013.01); *C09D 11/102* (2013.01); *C09D 11/324* (2013.01); *C09D 11/36* (2013.01); *C09D 11/38* (2013.01); *C09D 171/00* (2013.01); *G09F 9/00* (2013.01); *H05K 1/092* (2013.01); *H05K 3/12* (2013.01); *H05K 3/125* (2013.01); *H05K 3/1275* (2013.01); *H05K 2203/0534* (2013.01)

(58) Field of Classification Search
None
See application file for complete search history.

(56) References Cited

U.S. PATENT DOCUMENTS

| | | | |
|---|---|---|---|
| 2002/0188033 A1 | 12/2002 | Maeda | |
| 2005/0113483 A1* | 5/2005 | Takabayashi | C09D 11/101 523/160 |
| 2008/0210122 A1* | 9/2008 | Magdassi | B41M 5/007 106/31.05 |
| 2010/0068407 A1* | 3/2010 | Jeremic | C09D 11/101 427/511 |
| 2011/0195194 A1 | 8/2011 | Loccufier | |
| 2012/0148809 A1* | 6/2012 | Kobayashi | B82Y 10/00 428/195.1 |
| 2013/0177719 A1 | 7/2013 | Tasaka et al. | |
| 2013/0222497 A1* | 8/2013 | Nakano | B41J 2/21 347/100 |
| 2013/0222499 A1* | 8/2013 | Cong | B41J 2/2107 347/102 |
| 2014/0308531 A1* | 10/2014 | Miao | C09D 11/322 428/471 |

FOREIGN PATENT DOCUMENTS

| | | |
|---|---|---|
| CN | 1841197 | 10/2006 |
| CN | 101546121 | 9/2009 |
| CN | 102257432 | 11/2011 |
| CN | 103025839 | 4/2013 |
| JP | 2010-13596 A | 1/2010 |
| JP | 5117002 B2 | 1/2013 |
| JP | 2013147568 A | 8/2013 |
| JP | 5488175 B2 | 3/2014 |
| KR | 10-2013-0132322 A | 12/2013 |
| KR | 10-2014-0086584 A | 7/2014 |
| KR | 10-2014-0099560 A | 8/2014 |
| WO | 2014/010884 A1 | 1/2014 |

* cited by examiner

*Primary Examiner* — Joshua D Zimmerman
(74) *Attorney, Agent, or Firm* — Dentons US LLP

(57) ABSTRACT

The present invention relates to a UV-curable ink composition, a method for producing a bezel pattern of a display substrate using same, and a bezel pattern produced thereby, the UV-curable ink composition comprising a colorant, an epoxy resin, an oxetane resin, a photopolymerization initiator, and a surfactant comprising a polar functional group, wherein the content ratio of the epoxy resin to the oxetane resin is 1:0.5-1:6.

23 Claims, No Drawings

UV-CURABLE INK COMPOSITION, METHOD FOR PRODUCING BEZEL PATTERN OF DISPLAY SUBSTRATE USING SAME, AND BEZEL PATTERN PRODUCED THEREBY

TECHNICAL FIELD

This application is the National Stage Entry of International Application No. PCT/KR2015/010342 filed Sep. 30, 2015 and claims the benefit of priority based on Korean Patent Application Nos. 10-2014-0129417 dated Sep. 26, 2014 and 10-2015-0138095 dated Sep. 30, 2015, which are hereby incorporated by reference in their entirety into this application.

The present invention relates to a UV-curable ink composition, a method for producing a bezel pattern of a display substrate using the same, and a bezel pattern produced thereby.

BACKGROUND ART

In a display device, a method for forming a bezel pattern on a substrate has been used instead of using a separate bezel structure in order to achieve the weight reduction and thinning.

In the method for producing a display substrate in the related art, a photolithography method or a screen printing method is used in order to form a bezel pattern, but in the case of the photography method, there is a disadvantage in that the production costs for forming a pattern are expensive, and the process is complicated. In the case of the screen printing method, the thickness of a formed pattern due to high viscosity of a composition is increased to several tens of μm, and accordingly, a step difference occurs between a pattern formation part and a pattern non-formation part. Furthermore, for a bezel part having a white or gold color instead of a black color, a bezel part is formed by using a method for recoating the color several times in order to obtain an optical density at a proper level, and as the printing frequency of the bezel pattern is increased as described above, the step difference between the pattern formation part and the pattern non-formation part is further increased.

In particular, in the case of a touch panel display in which a bezel pattern is disposed on an internal side surface of a display device, there occurs a problem in that when a transparent conductive film is coated, the conductive film is discontinuously coated or short-circuited. Further, when an upper base material, for example, a film having an adhesive force such as a polarizing plate or a release film is attached to a surface on which a bezel pattern is formed, in the case where the step difference and the taper angle are large between the bezel pattern formation part and the bezel pattern non-formation part, the film is partially peeled off at the step difference site after the process is completed, and as a result, the appearance quality may be damaged, such as generation of micro bubbles, or peeling-off of the entire film. The cause for the release may occur when the restoring force of a deformed film at the time of being attached is larger than an adhesive force between the film and the pattern formation part or the pattern non-formation part.

Therefore, there is a need for developing a method in which adhesive force with a film is more improved than the method for forming a bezel pattern in the related art.

DISCLOSURE

Technical Problem

Therefore, the present invention has been made keeping in mind the above problems encountered in the related art, and an object of the present invention is to provide a method for producing a bezel pattern which does not exhibit a short-circuit due to a large step difference and the deterioration in appearance quality according to the generation of bubbles and the release of the film by using a UV-curable ink composition which exhibits a small taper angle and a thin film thickness to form a bezel pattern when the composition is cured, a bezel pattern produced thereby, and a display substrate including the same.

Technical Solution

In order to accomplish the above object, the present invention provides a UV-curable ink composition comprising a colorant, an epoxy resin, an oxetane resin, a photopolymerization initiator, and a surfactant comprising a polar functional group, wherein a content ratio of the epoxy resin to the oxetane resin is 1:0.5 to 1:6.

Further, the present invention provides a method for producing a bezel pattern for a display substrate, comprising: forming a bezel pattern on a substrate by using the UV-curable ink composition; and curing the bezel pattern.

In addition, the present invention provides a bezel pattern for a display substrate, which is formed on a substrate by curing the UV-curable ink composition.

Advantageous Effects

According to the present invention, it is possible to produce a bezel pattern which does not exhibit a short-circuit due to a large step difference and the deterioration in appearance quality according to the generation of bubbles and the release of the film by using a UV-curable ink composition which exhibits a small taper angle and a thin film thickness to form a bezel pattern when the composition is cured.

In the method for producing a bezel pattern of the present invention, the bezel pattern produced by using a UV-curable ink composition comprising a surfactant comprising a polar functional group has excellent attaching force to a base material and excellent coatability, and excellent attaching force to an upper base material.

BEST MODE

Hereinafter, the present invention will be described in more detail.

The present invention provides a UV-curable ink composition comprising a colorant, an epoxy resin, an oxetane resin, a photopolymerization initiator, and a surfactant comprising a polar functional group, wherein a content ratio of the epoxy resin to the oxetane resin is 1:0.5 to 1:6.

Further, the UV-curable ink composition of the present invention may further include one or more selected from the group consisting of an adhesion promoter, a diluent, and a photosensitizer.

In the UV-curable ink composition, a radical polymerizable resin and a cationic polymerizable resin may be usually used. The radical polymerizable resin is not suitable for curing of a thin film because of curing failure due to oxygen, and is not suitable for forming a bezel pattern because curing shrinkage is so large that adhesion to a glass base material is low. In contrast, the cationic polymerizable resin is advantageous in curing a thin film because the resin typically has low curing shrinkage and is slightly affected by oxygen.

The UV-curable ink composition used in the present invention includes an epoxy resin as a cationic curing component.

The epoxy resin is specifically selected from the group consisting of a bisphenol type epoxy resin, a novolac type epoxy resin, a glycidyl ester type epoxy resin, a glycidyl amine type epoxy resin, a linear aliphatic epoxy resin, a biphenyl type epoxy resin, and an alicyclic epoxy resin. In an exemplary embodiment of the present invention, the epoxy resin may be one or a mixture of two selected from the alicyclic epoxy compounds.

The alicyclic epoxy compound may mean a compound including one or more epoxidized aliphatic ring groups.

In the alicyclic epoxy compound including an epoxidized aliphatic ring group, the epoxidized aliphatic ring group means an epoxy group bonded to an alicyclic ring, and it is possible to exemplify a functional group, such as, for example, a 3,4-epoxycyclopentyl group, a 3,4-epoxycyclohexyl group, a 3,4-epoxycyclopentylmethyl group, a 3,4-epoxycyclohexylmethyl group, a 2-(3,4-epoxycyclopentyl)ethyl group, a 2-(3,4-epoxycyclohexyl)ethyl group, a 3-(3,4-epoxycyclopentyl)propyl group or a 3-(3,4-epoxycyclohexyl)propyl group. A hydrogen atom constituting the alicyclic ring may also be arbitrarily substituted with a substituent such as an alkyl group. As the alicyclic epoxy compound, for example, a compound to be specifically exemplified below may be used, but an available epoxy compound is not limited to the following types.

For example, it is possible to use dicyclopentadiene dioxide, cyclohexene oxide, 4-vinyl-1,2-epoxy-4-vinyl cyclohexene, vinyl cyclohexene dioxide, limonene monoxide, limonene dioxide, (3,4-epoxycyclohexyl)methyl-3,4-epoxycyclohexane carboxylate, 3-vinylcyclohexene oxide, bis(2,3-epoxycyclopentyl)ether, bis(3,4-epoxycyclohexyl methyl)adipate, bis(3,4-epoxy-6-methylcyclohexyl methyl) adipate, (3,4-epoxycyclohexyl)methyl alcohol, (3,4-epoxy-6-methylcyclohexyl)methyl-3,4-epoxy-6-methylcyclohexane carboxylate, ethylene glycol bis(3,4-epoxycyclohexyl)ether, 3,4-epoxycyclohexene carboxylic acid ethylene glycol diester, (3,4-epoxycyclohexyl)ethyl trimethoxysilane, Celloxide 8000 manufactured by Daicel Corp., and the like.

The content of the epoxy resin may be preferably 5 to 60 wt %, and more preferably 10 to 30 wt %, with respect to a total weight of the UV-curable ink composition. When the content exceeds 60 wt %, the coatability deteriorates, and when the content is less than 5 wt %, the sensitivity deteriorates.

The UV-curable ink composition includes an oxetane resin as another cationic polymerizable monomer.

The oxetane resin is a compound having a 4-membered cyclic ether group in a molecular structure thereof, and may serve to lower the viscosity of the cationically cured ink composition (for example, less than 50 cPs at 25° C.).

Specifically, it is possible to use 3-ethyl-3-hydroxymethyl oxetane 1,4-bis[(3-ethyl-3-oxetanyl)methoxymethyl]benzene, 3-ethyl-3-(phenoxymethyl)oxetane, di[(3-ethyl-3-oxetanyl)methyl]ether, 3-ethyl-3-(2-ethylhexyloxymethyl) oxetane, 3-ethyl-3-cyclohexyloxymethyl oxetane or phenol novolac oxetane, and the like. As the oxetane compound, it is possible to use, for example, 'ARON OXETANE OXT-101', 'ARON OXETANE OXT-121', 'ARON OXETANE OXT-211', 'ARON OXETANE OXT-221' or 'ARON OXETANE OXT-212', manufactured by Toagosei Co., Ltd., and the like. The oxetane compounds may be used either alone or in combination of two or more thereof.

The content of the oxetane resin may be preferably 15 to 80 wt %, and more preferably 40 to 60 wt %, with respect to the total weight of the UV-curable ink composition. When the content exceeds 80 wt %, the degree of cure is low, and when the content is less than 15 wt %, the viscosity is increased, and as a result, the coatability deteriorates.

Further, the oxetane resin of the present invention may be used while including an oxetane compound having one oxetane ring and an oxetane compound having two oxetane rings. When the oxetane compound having one oxetane ring and the oxetane compound having two oxetane rings are together used, there is an advantage in that the viscosity and the flexibility of the film may be adjusted. When two oxetane compounds are together used as described above, it is preferred to use the two oxetane compounds in a content range of the oxetane compound having one oxetane ring to the oxetane compound having two oxetane rings of 1:1.16 to 1:3.

Further, the present invention has a content ratio of the epoxy resin to the oxetane resin of 1:0.5 to 1:6. When the ratio of the epoxy compound and the oxetane compound exceeds 1:6, the coatability of the composition is excellent as the viscosity of the composition is low, but the curing sensitivity may deteriorate, and when the ratio is less than 1:0.5, the coatability may deteriorate as the viscosity of the composition is high.

The ink composition of the present invention includes a compound which produces a cationic species or a Bronsted acid by irradiation of UV rays as a cationic photopolymerization initiator, for example, an iodonium salt or a sulfonium salt, but the ink composition is not limited thereto.

The iodonium salt or sulfonium salt causes a curing reaction in which monomers having an unsaturated double bond contained in ink are reacted to form a polymer during the UV curing process to occur, and a photosensitizer may also be used according to the polymerization efficiency.

As an example, the photopolymerization initiator may be a photopolymerization initiator having an anion represented by $SbF_6^-$, $AsF_6^-$, $BF_6^-$, $(C_6F_5)_4B^-$, $PF_6^-$ or $RfnF_{6-n}$, but is not limited thereto.

The photopolymerization initiator may be included in an amount of preferably 1 to 15 wt %, and more preferably 2 to 10 wt %, with respect to the total weight of the UV-curable ink composition. When the content of the photopolymerization initiator is less than 1 wt %, the curing reaction is not sufficient, and when the content exceeds 15 wt %, the photopolymerization initiator is not all dissolved, or the viscosity is increased, and as a result, the coatability may deteriorate.

The UV-curable ink composition comprises a surfactant comprising a polar functional group in order to exhibit a small taper angle, or to lower the surface tension of the ink composition. The surfactant comprising the polar functional group may include one functional group selected from the group consisting of a carboxyl group, a hydroxy group, a phosphate, and a sulfonate.

Most of the silicone-based surfactants in the related art have an advantage in that the coatability to a base material is excellent, and the taper angle is small, but when a bezel part pattern is formed by applying an ink composition on a base material, and then a film on which an adhesive is applied, including a polarizing plate is attached thereto, an attaching force between the base material and the film deteriorates, and as a result, defects may occur. In contrast, non-silicone-based and fluorine-based surfactants have an advantage in that an attaching force between a bezel part formed on a base material and a film coated with an adhesive is excellent, and the film coated with the adhesive is not limited to a polarizing plate, or a Nichiban tape and a release film. In particular, a surfactant comprising a hydroxyl group (OH—) or a carboxyl group (COOH—), which includes a polar reactive group has high affinity for the adhesive components, and thus is particularly preferably used in terms of attaching force. It is more preferred to use a hydrophilic fluorine-based surfactant or a non-silicone-based surfactant, or a silicone-based surfactant comprising a hydroxyl group in order to improve the coatability to the base material.

Specifically, the surfactant may be a polymer-type or oligomer-type fluorine-based surfactant, and it is possible to use a surfactant which is not dissolved in a solvent which is very non-polar (the solubility parameter value is less than 15 $(MPa)^{0.5}$), for example, in hexane. Further, the surfactant may be a polymer-type or oligomer-type fluorine-based surfactant, and it is possible to use a surfactant which is not dissolved in an amount of 0.1 wt % or more in a solvent which is very polar (the solubility parameter value is 45 $(MPa)^{0.5}$ or more), for example, in water. In addition, the surfactant may be a polymer-type or oligomer-type fluorine-based surfactant, and it is possible to use a surfactant capable of being dissolved in an amount of 1 wt % or more in a solvent which is appropriately polar (the solubility parameter value is approximately 21 $(MPa)^{0.5}$), for example, in propylene glycol monomethyl ether and showing no phase separation. Furthermore, the surfactant may be a polymer-type or oligomer-type fluorine-based surfactant, and it is possible to use a surfactant capable of being dissolved in an amount of 0.1 wt % or more in a solvent which is also appropriately polar (the solubility parameter value is approximately 18 $(MPa)^{0.5}$), for example, in toluene and showing no phase separation. As the appropriate polar value, the solubility parameter value may be 15 to 21 $(MPa)^{0.5}$.

Further, the surfactant is preferably a polymer-type or oligomer-type fluorine-based surfactant, and it is possible to use a surfactant which is not dissolved in a solvent having a solubility parameter value of less than 15 $(MPa)^{0.5}$, is not dissolved in an amount of 0.1 wt % or more in a solvent having a solubility parameter value of 45 $(MPa)^{0.5}$ or more, and is dissolved in an amount of 1 wt % or more in a solvent having a solubility parameter value of 15 to 21 $(MPa)^{0.5}$ and shows no phase separation.

In addition, as the surfactant, a surfactant comprising a reactive hydroxy group as a silicone-based additive may be used. Furthermore, as the surfactant, a non-silicone-based surfactant which does not include a fluorine component may be used.

As the fluorine-based surfactant, the non-silicone-based surfactant, and the silicone-based surfactant comprising a hydroxyl group, commercially available products may be used, and for example, it is possible to use those selected from the group consisting of Megaface F-251, F-281, F-560, F-561, F-562, F-563, F-565, F-568, F-570 and F-571, which are manufactured by DaiNippon Ink & Chemicals (DIC), Inc., or Surflon S-111, S-112, S-113, S-121, S-131, S-132, S-141 and S-145, which are manufactured by Asahi Glass Co., Ltd., or Fluorad FC-93, FC-95, FC-98, FC-129, FC-135, FC-170C, FC-430 and FC-4430, which are manufactured by Sumitomo 3M, Co., Ltd., or Zonyl FS-300, FSN, FSN-100 and FSO, which are manufactured by Dupont Co., and BYK-350, BYK-354, BYK-355, BYK-356, BYK-358N, BYK-359, BYK-361N, BYK-381, BYK-388, BYK-392, BYK-394, BYK-399, BYK-3440, BYK-3441, BYKE-TOL-AQ, BYK-DYNWET 800, and the like, which are manufactured by BYK Chemie.

The surfactant comprising the polar functional group is included in an amount of preferably 0.1 to 5.0 wt %, and more preferably 0.5 to 3.0 wt % with respect to the total weight of the UV-curable ink composition. There are problems in that when the content of the surfactant is less than 0.1 wt %, an effect of lowering the surface tension of the composition is not sufficient, and as a result, coating defects occur when the composition is coated, and when the content exceeds 5.0 wt %, the surfactant is used in an excessive amount, and as a result, the compatibility with the composition and the anti-foaming property are rather reduced.

The UV-curable ink composition includes a colorant.

As the colorant, one or more pigments, dyes, or mixtures thereof may be used, and the colorant is not particularly limited as long as the colorant may express a color if necessary.

As an exemplary embodiment of the present invention, it is possible to use carbon black, graphite, metal oxides, an organic black pigment, and the like as a black pigment.

Examples of carbon black may include SEAST 5HIISAF-HS, SEAST KH, SEAST 3HHAF-HS, SEAST NH, SEAST 3M, SEAST 300HAF-LS, SEAST 116HMMAF-HS, SEAST 116MAF, SEAST FMFEF-HS, SEAST SOFEF, SEAST VGPF, SEAST SVHSRF-HS and SEAST SSRF (Tokai Carbon Co., Ltd.); DIAGRAM BLACK II, DIAGRAM BLACK N339, DIAGRAM BLACK SH, DIAGRAM BLACK H, DIAGRAM LH, DIAGRAM HA, DIAGRAM SF, DIAGRAM N550M, DIAGRAM M, DIAGRAM E, DIAGRAM G, DIAGRAM R, DIAGRAM N760M, DIAGRAM LR, #2700, #2600, #2400, #2350, #2300, #2200, #1000, #980, #900, MCF88, #52, #50, #47, #45, #45L, #25, #CF9, #95, #3030, #3050, MA7, MA77, MA8, MA11, MA100, MA40, OIL7B, OIL9B, OIL11B, OIL30B and OIL31B (Mitsubishi Chemical Corp.); PRINTEX-U, PRINTEX-V, PRINTEX-140U, PRINTEX-140V, PRINTEX-95, PRINTEX-85, PRINTEX-75, PRINTEX-55, PRINTEX-45, PRINTEX-300, PRINTEX-35, PRINTEX-25, PRINTEX-200, PRINTEX-40, PRINTEX-30, PRINTEX-3, PRINTEX-A, SPECIAL BLACK-550, SPECIAL BLACK-350, SPECIAL BLACK-250, SPECIAL BLACK-100, and LAMP BLACK-101 (Degussa Co., Ltd.); RAVEN-1100ULTRA, RAVEN-108OUL-TRA, RAVEN-106OULTRA, RAVEN-1040, RAVEN-1035, RAVEN-1020, RAVEN-1000, RAVEN-890H, RAVEN-890, RAVEN-88OULTRA, RAVEN-86OULTRA, RAVEN-850, RAVEN-820, RAVEN-79OULTRA, RAVEN-78OULTRA, RAVEN-76OULTRA, RAVEN-520, RAVEN-500, RAVEN-460, RAVEN-450, RAVEN-43OULTRA, RAVEN-420, RAVEN-410, RAVEN-250OULTRA, RAVEN-2000, RAVEN-1500, RAVEN-1255, RAVEN-1250, RAVEN-1200, RAVEN-119OULTRA, and RAVEN-1170 (Colombia Carbon Co., Ltd.) or mixtures thereof, and the like.

As the organic black pigment, aniline black, lactam black or perylene black series, and the like may be used, but the organic black pigment is not limited thereto.

In the present invention, the UV-curable ink composition is cured by irradiation of UV rays (for example, 250 or 450 nm), more preferably UV rays with a long wavelength (for example, 360 to 410 nm), and thus has a certain level of optical density (OD). For this purpose, the content of the colorant may be preferably 1 to 15 wt %, and more preferably 3 to 10 wt %, with respect to the total weight of the UV-curable ink composition. When the content of the colorant is less than 1 wt %, a level of OD which may not be applied to the bezel is not exhibited, and when the content exceeds 15 wt %, an excessive amount of the colorant is not dispersed in ink, and a precipitate may be formed.

When the content of the colorant is within the range, the OD may be maintained in a range of 0.05 to 2.5 per a film thickness of 1.0 μm.

The ink composition may further include a diluent in order to improve the coatability by reducing the viscosity of the ink to increase the fluidity.

As the diluent, it is possible to use one or more selected from the group consisting of methyl ethyl ketone, methyl cellosolve, ethyl cellosolve, ethylene glycol dimethyl ether, ethylene glycol diethyl ether, propylene glycol dimethyl ether, propylene glycol diethyl ether, diethylene glycol dimethyl ether, diethylene glycol diethyl ether, diethylene glycol methyl ethyl ether, 2-ethoxy propanol, 2-methoxy propanol, 2-ethoxy ethanol, 3-methoxy butanol, cyclohexanone, cyclopentanone, propylene glycol methyl ether acetate, propylene glycol ethyl ether acetate, 3-methoxybutyl acetate, ethyl 3-ethoxypropionate, ethyl cellosolve acetate, methyl cellosolve acetate, butyl acetate, dipropylene glycol monomethyl ether, cyclohexene oxide and propylene carbonate, but the diluent is not limited thereto.

The content of the diluent may be preferably 0 to 30 wt %, and more preferably 0.1 to 20 wt %, with respect to the total weight of the UV-curable ink composition. When the content exceeds 30 wt %, the curing sensitivity deteriorates.

The UV-curable ink composition may further include a photosensitizer in order to complement the curability in an active energy ray having a long wavelength.

The photosensitizer may be one or more selected from the group consisting of anthracene-based compounds, such as anthracene, 9,10-dibutoxy anthracene, 9,10-dimethoxy anthracene, 9,10-diethoxy anthracene, and 2-ethyl-9,10-dimethoxy anthracene; benzophenone-based compounds, such as benzophenone, 4,4-bis(dimethylamino)benzophenone, 4,4-bis(diethylamino)benzophenone, 2,4,6-trimethylaminobenzophenone, methyl-o-benzoylbenzoate, 3,3-dimethyl-4-methoxybenzophenone, and 3,3,4,4-tetra(t-butylperoxycarbonyl)benzophenone; acetophenone; ketone-based compounds, such as dimethoxy acetophenone, diethoxy acetophenone, 2-hydroxy-2-methyl-1-phenylpropan-1-one, and propanone; perylene; fluorenone-based compounds, such as 9-fluorenone, 2-chloro-9-fluorenone, and 2-methyl-9-fluorenone; thioxanthone-based compounds, such as thioxanthone, 2,4-diethylthioxanthone, 2-chlorothioxanthone, 1-chloro-4-propyloxythioxanthone, isopropylthioxanthone (ITX) and diisopropylthioxanthone; xanthone-based compounds, such as xanthone and 2-methylxanthone; anthraquinone-based compounds, such as anthraquinone, 2-methyl anthraquinone, 2-ethyl anthraquinone, t-butyl anthraquinone and 2,6-dichloro-9,10-anthraquinone; acridine-based compounds, such as 9-phenylacridine, 1,7-bis(9-acridinyl)heptane, 1,5-bis(9-acridinyl)pentane and 1,3-bis(9-acridinyl)propane; dicarbonyl compounds, such as benzyl, 1,7,7-trimethyl-bicyclo[2,2,1]heptane-2,3-dione and 9,10-phenanthrenequinone; phosphine oxide-based compounds, such as 2,4,6-trimethylbenzoyl diphenylphosphine oxide and bis(2,6-dimethoxybenzoyl)-2,4,4-trimethylpentyl phosphine oxide; benzoate-based compounds, such as methyl-4-(dimethylamino)benzoate, ethyl-4-(dimethylamino)benzoate, and 2-n-butoxyethyl-4-(dimethylamino)benzoate; amino synergists, such as 2,5-bis(4-diethylaminobenzal)cyclopentanone, 2,6-bis(4-diethylaminobenzal)cyclohexanone and 2,6-bis(4-diethylaminobenzal)-4-methyl-cyclohexanone; coumarin-based compounds, such as 3,3-carbonylvinyl-7-(diethylamino)coumarin, 3-(2-benzothiazolyl)-7-(diethylamino)coumarin, 3-benzoyl-7-(diethylamino) coumarin, 3-benzoyl-7-methoxy-coumarin and 10,10-carbonylbis[1,1,7,7-tetramethyl-2,3,6,7-tetrahydro-1H,5H, 11H—Cl]-benzopyrano[6,7,8-ij]-quinolizin-11-one; chalcone compounds, such as 4-diethylaminochalcone and 4-azidobenzalacetphenone; 2-benzoylmethylene; and 3-methyl-b-naphthothiazoline.

The photosensitizer is included in an amount of preferably 1 to 200 parts by weight, and more preferably 10 to 100 parts by weight, with respect to 100 parts by weight of the photopolymerization initiator. There are problems in that when the content is less than 1 part by weight, the curing sensitivity synergistic action may not be expected at a desired wavelength, and when the content exceeds 200 parts by weight, the photosensitizer is not dissolved and the attaching force of the pattern and the crosslinking density deteriorate.

The UV-curable ink composition may further include an adhesion promoter as an additive.

The film attached on the bezel pattern repeatedly shrinks and expands depending on the use conditions such as temperature and humidity, so that stress is imposed on the bezel pattern, and as a result, the film and the bezel may fall off from the base material. When one or more silane-based compounds selected from the group consisting of alkoxy silane-based compounds, epoxy silane-based compounds, aminophenyl silane-based compounds, amino silane-based compounds, mercapto silane-based compounds, and vinyl silane-based compounds are used as an adhesion promoter in order to prevent the fall-off, an excellent result may be exhibited.

Among them, epoxy silane-based compounds are more preferred as the adhesion promoter of the present invention.

The adhesion promoter is included in an amount of preferably 0.1 to 15 wt %, and more preferably 2 to 10 wt %, with respect to the total weight of the ink composition. There are problems in that when the content is less than 0.1 wt %, the bezel pattern cannot be prevented from being peeled off from the base material, and when the content exceeds 15 wt %, the viscosity of the ink solution is increased, and the dispersibility is low.

The UV-curable ink composition used in the present invention spreads within a short period of time immediately after inkjet printing, and thus exhibits excellent coating film characteristics, and the composition is cured to exhibit excellent adhesive characteristics. The excellent spreadability of the UV-curable ink composition of the present invention may be specifically exhibited as a contact angle with respect to a glass base material of less than 10°. Therefore, when the UV-curable ink composition is applied, it is preferred to dispose a UV-lamp right behind the inkjet head such that the ink composition may be cured simultaneously with the inkjet printing.

The dose for curing the UV-curable ink composition is 1 to 10,000 $mJ/cm^2$, preferably 80 to 2,000 $mJ/cm^2$.

The UV-curable ink composition is cured by absorbing radiation in a wavelength range of 250 nm to 450 nm, preferably 360 nm to 410 nm.

The UV-curable ink composition has a viscosity of 1 cP to 50 cP at 25° C., more preferably 3 cP to 45 cP at 25° C. as an example, and thus is suitable for the inkjet process. The UV-curable ink composition having the aforementioned viscosity range has a good discharge at the process temperature. The process temperature means a temperature heated so as to lower the viscosity of the UV-curable ink composition. The process temperature may be 10° C. to 100° C., preferably 20° C. to 70° C.

The UV-curable ink composition has excellent attaching force and coatability with respect to the base material.

Further, since the UV-curable ink composition comprises a surfactant comprising a polar functional group, a bezel pattern formed according to the present invention has excellent attaching force to a film on which an adhesive is applied. Specifically, the upper portion attaching force of the UV-curable ink composition of the present invention after being cured may have a value of 500 to 5,000 gf/25 mm.

The top portion of a bezel pattern formed by using the UV-curable ink composition is attached to the film on which the adhesive is applied through an adhesive layer, and since the UV-curable ink composition exhibits excellent attaching force to an adhesive for an upper base material, such as an acrylic adhesive, a styrene butadiene rubber-based adhesive, an epoxy adhesive, a polyvinyl alcohol-based adhesive, and a polyurethane-based adhesive, it is possible to obtain an effect in which the attaching force between the bezel pattern and the upper base material is improved when the UV-curable ink composition is used.

In the present invention, the upper base material is not limited to a polarizing plate or a protective film. However, since the attaching force may be differently measured depending on the type of adhesive applied on the film, the standard for measuring the upper portion attaching force described in the present invention employs values measured by using a Nichiban CT-24 tape used in the Japanese Industrial Standard JIS Z 1522 as a standard. At this time, attaching force characteristics in that the attaching force between the bezel pattern and the upper base material has a range of 500 to 5,000 gf/25 mm belong to the feature category of the present invention.

The method for producing a bezel pattern of a display substrate according to the present invention uses the UV-curable ink composition.

Specifically, the method for producing a bezel pattern of a display substrate according to the present invention includes: a) forming a bezel pattern on a substrate by using the UV-curable ink composition; and b) curing the bezel pattern.

In addition, the method for producing a bezel pattern of a display substrate according to the present invention may further include cleaning and drying the substrate prior to a) the forming of the bezel pattern. The cleaning and drying is for selectively carrying out a surface treatment depending on the surface energy of the substrate in order to improve coating properties of the ink and remove stains caused by foreign substances.

Specifically, the surface treatment may be carried out by a treatment such as a wet surface treatment, a UV ozone treatment, and a normal pressure plasma treatment.

As the method for forming a bezel pattern on the substrate, it is possible to use a method selected from an inkjet printing using a UV-curable resin instead of photolithography and screen printing, a gravure coating, and a reverse offset coating. In order to applying the method, the ink composition of the present invention may have a viscosity of 1 cP to 50 cP, and preferably 3 cP to 45 cP.

In order to form a bezel pattern on a specific portion of the substrate by the aforementioned method, the ink composition having a low viscosity of 1 cP to 50 cP is applied at a height of 0.1 to 20 μm, and more specifically 0.5 to 5 μm. The applied composition is cured by exposure including UV rays, and as a result, a bezel pattern having a thin film thickness of 0.1 to 20 μm, and more specifically 0.5 to 5 μm may be manufactured.

The UV-curable ink composition used in the present invention spreads within a short period of time immediately after inkjet printing, and thus exhibits excellent coating film characteristics, and the composition is cured to exhibit excellent adhesive characteristics. The excellent spreadability of the UV-curable ink composition of the present invention may be specifically exhibited as a contact angle with respect to a glass base material of less than 10°. Therefore, when the UV-curable ink composition is applied, it is preferred to dispose a UV-lamp right behind the inkjet head such that the ink composition may be cured simultaneously with the inkjet printing.

In the present invention, examples of a light source for curing the UV-curable composition include a mercury vapor arc, a carbon arc, a Xe arc, an LED curing device, and the like, which emit a light with a wavelength of 250 nm to 450 nm, but are not limited thereto.

The bezel pattern has a taper angle of more than 0° and 30° or less and a thickness of 0.1 μm to 20 μm, which are measured after a curing treatment. Further, the taper angle may be preferably more than 0° and 10° or less. In addition, the thickness may be preferably 0.5 μm to 5 μm. The bezel pattern of the present invention has the aforementioned features, and thus may not exhibit a short-circuit due to a large step difference and deterioration in appearance quality due to generation of bubbles and release of the film.

The optical density of the bezel pattern may be 0.05 to 2.5 per a film thickness of 1.0 μm, and 0.25 to 1.0, if necessary. In this case, there is an advantage in that shielding characteristics due to the bezel pattern are excellent. When the optical density exceeds 2.5, the manufacture of ink and the inkjet process may be adversely affected because a required content of pigment to be introduced is very high, and it is possible to inhibit the UV-curable ink composition from being cured by radiation.

Further, since the UV-curable ink composition comprises a surfactant comprising a polar functional group, a bezel pattern formed according to the present invention has excellent attaching force to a film on which an adhesive is applied, including a polarizing plate. Specifically, the upper portion attaching force of the UV-curable ink composition of the present invention after being cured may have a value of 500 to 5,000 gf/25 mm.

The present invention provides a bezel pattern of a display substrate, which is manufactured by the method. The bezel pattern in the present invention refers to a pattern formed at the edge portion of various devices such as a clock and a display device.

The bezel pattern has a taper angle of more than 0° and 30° or less and a thickness of 0.1 μm to 20 μm, which are measured after a curing treatment. Further, the taper angle may be preferably more than 0° and 10° or less. In addition, the thickness may be preferably 0.5 μm to 5 μm. The bezel pattern of the present invention has the aforementioned features, and thus may not exhibit a short-circuit due to a large step difference and deterioration in appearance quality due to generation of bubbles and release of the film.

The optical density of the bezel pattern may be 0.05 to 2.5 per a film thickness of 1.0 μm, and 0.25 to 1.0, if necessary. In this case, there is an advantage in that shielding characteristics due to the bezel pattern are excellent. When the optical density exceeds 5, the manufacture of ink and the inkjet process may be adversely affected because a required content of pigment to be introduced is very high, and it is possible to inhibit the UV-curable ink composition from being cured by radiation.

Further, since the UV-curable ink composition comprises a surfactant comprising a polar functional group, a bezel pattern formed according to the present invention has excellent attaching force to a film on which an adhesive is applied, including a polarizing plate. Specifically, the upper portion attaching force of the UV-curable ink composition of the present invention after being cured may have a value of 500 to 5,000 gf/25 mm.

Furthermore, the present invention provides a display substrate including the bezel pattern.

The display device may be a display device used in any one of a plasma display panel (PDP), a light emitting diode (LED), an organic light emitting diode (OLED), a liquid crystal display (LCD) device, a thin film transistor-liquid crystal display (LCD-TFT) device, and a cathode ray tube (CRT).

Mode for Invention

Hereinafter, the present invention will be described in detail with reference to the Examples. The following Examples are provided for describing the present invention, and the scope of the present invention includes the scope described in the following claims and the substitution and modification thereof, and is not limited to the scope of the Examples.

EXAMPLES

The compositions for forming a bezel pattern in Examples 1 to 6 and Comparative Examples 1 to 6 were prepared by mixing the compositions as in the following Table 1 and stirring the compositions for 3 hours.

TABLE 1

| | Colorant A | Epoxy B | Oxetane C | Polymerization initiator D | Surfactant E | Photosensitizer H |
|---|---|---|---|---|---|---|
| Example | | | | | | |
| 1 | A1: 5 | B1: 18 | C2: 71 | D1: 5 | E1: 1 | H1: 0.5 |
| 2 | A1: 5 | B1: 18 | C2: 71 | D1: 5 | E2: 1 | H1: 0.5 |
| 3 | A1: 5 | B1: 18 | C2: 71 | D1: 5 | E3: 1 | H1: 0.5 |
| 4 | A1: 5 | B1: 18 | C2: 71 | D1: 5 | E4: 1 | H1: 0.5 |
| 5 | A1: 5 | B1: 18 | C2: 71 | D1: 5 | E5: 1 | H1: 0.5 |
| 6 | A1: 5 | B1: 18 | C2: 71 | D1: 5 | E5: 1 | H2: 0.5 |
| Comparative Example | | | | | | |
| 1 | A1: 5 | B1: 18 | C2: 71 | D5: 5 | E6: 1 | H1: 0.5 |
| 2 | A1: 5 | B1: 18 | C2: 71 | D3: 5 | E7: 1 | H1: 0.5 |
| 3 | A1: 5 | B1: 18 | C2: 71 | D3: 5 | — | H1: 0.5 |
| 4 | A1: 5 | B1: 18 | C2: 71 | D3: 5 | E8: 1 | H1: 0.5 |
| 5 | A1: 5 | B1: 18 | C2: 71 | D1: 5 | E9: 1 | H1: 0.5 |
| 6 | A1: 5 | B1: 18 | C2: 71 | D1: 5 | E10: 1 | H1: 0.5 |

A1: Carbon black
B1: Celloxide 2021P (Daicel Corp.)
C2: ARON OXETANE 221 (Toagosei Co., Ltd.)
D1: CPI-200K (San-Apro Ltd.)
D2: WPI-130 (WAKO)
E1: F-568 (DIC)
E2: BYK-388 (BYK Chemie)
E3: BYK-399 (BYK Chemie)
E4: BYK-370 (BYK Chemie)
E5: BYK-3441 (BYK Chemie)

TABLE 1-continued

| | Colorant A | Epoxy B | Oxetane C | Polymerization initiator D | Surfactant E | Photosensitizer H |
|---|---|---|---|---|---|---|

E6: RS-75 (DIC)
E7: F-558 (DIC)
E8: F-554 (DIC)
E9: T-410 (TEGO)
E00: BYK-330 (BYK Chemie)
H1: 9,10-dibutoxyanthracene
H2: 2-isopropylthioxanthone <Preparation Example 1> Manufacture of Bezel Pattern The compositions prepared in Examples 1 to 6 and Comparative Examples 1 to 6 were cured on a cleaned LCD glass base material, and then were coated by the inkjet coating method so as to have a thickness of 2 μm after the compositions were cured. Bezel patterns were formed by irradiating ultraviolet rays on the coating layer under the following conditions within 1 minute after the coating in order to prevent foreign substances from being attached and curing the compositions. As a UV ray irradiation device, a UV-LED lamp with a wavelength of 395 nm was used. After each irradiation, latex gloves were worn in order to determine whether the bezel pattern was cured, and then the indentation and tack sense were observed by pressing the bezel pattern.

<Preparation Example 2> Manufacture of Display Device Using Bezel Pattern

A bezel pattern was formed on the upper surface of the display panel (hereinafter, referred to as the panel) by the method in Preparation Example 1, and a polarization film was attached thereto. After the attachment, the surroundings thereof were capped by a sealant in order to prevent moisture and foreign substance from being incorporated into the cross-sections of the polarization film and the pattern.

<Experimental Example 1>: Evaluation of Polarity of Surfactant

The solubilities of the surfactants used in the Examples and the Comparative Examples of the present invention were evaluated, whether the surfactants were polar was evaluated, and the results are shown in the following Table 2.

TABLE 2

| | Solubility with respect to solvent (Surfactant 1 wt %) | | | |
|---|---|---|---|---|
| | Hexane | Toluene | PGME | Water |
| E1 | Not dissolved | Dissolved | Dissolved | Not dissolved |
| E2 | Not dissolved | Dissolved | Dissolved | Not dissolved |
| E3 | Not dissolved | Dissolved | Dissolved | Not dissolved |
| E4 | Not dissolved | Dissolved | Dissolved | Not dissolved |
| E5 | Not dissolved | Dissolved | Dissolved | Not dissolved |
| E6 | Not dissolved | Not dissolved | Dissolved | Not dissolved |
| E7 | Not dissolved | Not dissolved | Dissolved | Not dissolved |
| E8 | Dissolved | Dissolved | Dissolved | Not dissolved |

As a result of the experiment, the surfactants included in the ink compositions in Examples 1 to 5 were not dissolved in a non-polar solvent such as hexane or a polar solvent such as water, but were well dissolved in a solvent having a suitable solubility such as toluene or polypropylene glycol monomethyl ether (PGME). In contrast, the surfactants included in the ink compositions in Comparative Examples 1, 2, and 4 exhibited different dissolution behaviors.

<Experimental Example 2>: Measurement of Taper Angle

The SEM photographs of the cross-section of the bezel pattern prepared in Preparation Example 1 were taken to measure each taper angle, and the results are shown in the following Table 3.
  o: Taper angle is 10° or less
  Δ: Taper angle is 10° to 30°
  x: Taper angle is 30° or more <Experimental Example 3>: Evaluation of Spreadability The compositions prepared in Examples 1 to 6 and Comparative Examples 1 to 6 were applied on a cleaned LCD glass base material, and then the contact angles were measured, and the results are shown in the following Table 3.

<Experimental Example 4>: Evaluation of Attaching Force Between Film/Bezel Pattern The film coated with an adhesive was cut into a width of 25 mm and a length of 50 to 100 mm in size and disposed on the prepared bezel pattern, and the film was attached to the bezel pattern at normal temperature by using a roll laminator. A 180° attaching force test was performed by a texture analyzer apparatus manufactured by TA Instruments while pulling the ends of the coated film to evaluate the attaching force between the film and the bezel, and the results are shown in the following Table 3. In the evaluation of the attaching force, the good is assigned to the case where the attaching force was 500 gf or more, and the bad is assigned to the case where the attaching force was 500 gf or less, when the Nichiban CT-24 tape was used.

functional group was used exhibited low contact angles and high upper portion attaching forces, whereas there is a problem in that the ink compositions in Comparative Examples 1, 2, and 4 to 6 in which a surfactant comprising no polar functional group was used had low upper portion attaching forces. There was a problem in that when the ink composition in Comparative Example 3 included no surfactant, the upper portion attaching force exhibited higher values than the composition in Comparative Examples 1, 2, and 4 to 6, but exhibited high contact angles.

The invention claimed is:

1. A UV-curable ink composition for forming a bezel pattern, consisting essentially of:
   a surfactant comprising a polar functional group, wherein:
      the surfactant is a non-silicone-based surfactant which does not comprise a fluorine component and the polar functional group comprises a carboxyl group, and the surfactant is selected from among BYK-359, BYK-388, BYK-394, and BYK-399;
   a colorant;
   an alicyclic epoxy compound including an epoxidized aliphatic ring group;
   an oxetane compound having two oxetane rings present in an amount of 60 to 80 wt % with respect to the total weight of the UV-curable ink composition;
   an iodonium salt comprising an anion selected from among $SbF_6^-$, $AsF_6^-$, $BF_6^-$, $(C_6F_5)_4B^-$, $PF_6^-$, and $Rf_nF_{6-n}$ as a cationic photopolymerization initiator; and
   optionally one or more components selected from the group consisting of an adhesion promoter, a diluent, and a photosensitizer,
   wherein:
   the surfactant comprising the polar functional group is present in an amount of 0.1 to 5.0 wt % with respect to a total weight of the UV-curable ink composition;
   a ratio of the epoxy compound to the oxetane compound is 1:3.94 to 1:6; and
   the UV-curable ink composition has an upper portion attaching force of 500 to 5,000 gf/25 mm after being cured.

TABLE 3

| Example | Whether cured or not<br>5 minutes after UV irradiation, ○: tack-free Δ: Tack sense X: Unreacted | Spreadability Conditions<br>Contact angle<br>○: <10° Δ: 10°~30° X: >30° | Taper angle<br>Taper angle ○: <10° Δ: 10°~30° X: >30° | Upper portion attaching force<br>peel test (Nichiban tape) |
|---|---|---|---|---|
| 1 | ○ | ○ | ○ | 700~2000 |
| 2 | ○ | ○ | ○ | 600~800 |
| 3 | ○ | ○ | ○ | 500~1000 |
| 4 | ○ | ○ | ○ | 500~1000 |
| 5 | ○ | ○ | ○ | 300~800 |
| 6 | ○ | ○ | ○ | 300~800 |
| Comparative Example | | | | |
| 1 | ○ | ○ | ○ | 250~350 |
| 2 | ○ | ○ | ○ | 100~200 |
| 3 | ○ | X | X | — |
| 4 | ○ | ○ | ○ | 100~200 |
| 5 | ○ | ○ | ○ | 10~50 |
| 6 | ○ | ○ | ○ | 10~40 |

As a result of the experiments, the ink compositions in Examples 1 to 6 in which a surfactant comprising a polar 2. The UV-curable ink composition of claim 1, wherein the surfactant is not dissolved in a solvent having a solubility parameter value of less than 15 (MPa)$^{0.5}$, is not dissolved in an amount of 0.1 wt % or more in a solvent having a solubility parameter value of 45 (MPa)$^{0.5}$ or more, and is dissolved in an amount of 1 wt % or more in a solvent having a solubility parameter value of 15 to 21 (MPa)$^{0.5}$ and shows no phase separation.

3. The UV-curable ink composition of claim 2, wherein the solvent having a solubility parameter value of less than 15 (MPa)$^{0.5}$ is hexane, the solvent having a solubility parameter value of 45 (MPa)$^{0.5}$ or more is water, and the solvent having a solubility parameter value of 15 to 21 (MPa)$^{0.5}$ is propylene glycol monomethyl ether (PGME) or toluene.

4. The UV-curable ink composition of claim 1, wherein the epoxy compound is present in an amount of 10 to 20 wt % with respect to the total weight of the UV-curable ink composition.

5. The UV-curable ink composition of claim 1, wherein the photopolymerization initiator is present in an amount of 1 to 15 wt % with respect to the total weight of the UV-curable ink composition.

6. The UV-curable ink composition of claim 1, wherein the colorant is present in an amount of 1 to 15 wt % with respect to the total weight of the UV-curable ink composition.

7. The UV-curable ink composition of claim 1, wherein the diluent is present in an amount of 0 to 30 wt % with respect to the total weight of the UV-curable ink composition.

8. The UV-curable ink composition of claim 1, wherein a dose for curing the UV-curable ink composition is 1 to 10,000 mJ/cm$^2$.

9. The UV-curable ink composition of claim 1, wherein the UV-curable ink composition has a viscosity of 1 cP to 50 cP at 25° C.

10. The UV-curable ink composition of claim 1, wherein the UV-curable ink composition has a contact angle with respect to a glass base material of less than 10°.

11. A method for producing a bezel pattern for a display substrate, comprising:
  a) forming a bezel pattern on a substrate by applying the UV-curable ink composition of claim 1 to the substrate; and
  b) curing the bezel pattern by irradiating the bezel pattern with UV light having a wavelength of 360-410 nm.

12. The method of claim 11, further comprising cleaning and drying the substrate prior to a) the forming of the bezel pattern,
  wherein the cleaning and drying of the substrate is carried out by one or more treatments selected from the group consisting of a wet surface treatment, a UV ozone treatment, and a normal pressure plasma treatment,
  wherein the method of forming the bezel pattern on the substrate in Step a) is a method selected from an inkjet printing, a gravure coating, and a reverse offset coating.

13. The method of claim 11, wherein Step a) is carried out at a process temperature of 10° C. to 100° C.

14. The method of claim 11, wherein the bezel pattern in Step b) has an upper portion attaching force of 500 to 5,000 gf/25 mm.

15. The method of claim 11, wherein the bezel pattern has a thickness of 0.1 μm to 20 μm.

16. A bezel pattern for a display substrate, which is formed on a substrate by curing the UV-curable ink composition of claim 1.

17. The bezel pattern of claim 16, wherein the bezel pattern has a thickness of 0.1 μm to 20 μm.

18. The bezel pattern of claim 17, wherein the bezel pattern has a thickness of 0.5 μm to 5 μm.

19. The bezel pattern of claim 16, wherein the bezel pattern has a taper angle of 0° to 30°.

20. The bezel pattern of claim 19, wherein the bezel pattern has a taper angle of 0° to 10°.

21. The bezel pattern of claim 16, wherein the bezel pattern has an OD value of 0.05 to 2.5 per a film thickness of 1.0 μm.

22. The bezel pattern of claim 16, wherein the bezel pattern has an upper portion attaching force of 500 to 5,000 gf/25 mm.

23. The UV-curable ink composition of claim 1, wherein the composition contains a photosensitizer selected from the group consisting of 9,10-dibutoxy anthracene, 9,10-dimethoxy anthracene, 9,10-diethoxy anthracene, and 2-ethyl-9,10-dimethoxy anthracene.

* * * * *